United States Patent [19]
Lange

[11] Patent Number: 4,665,560
[45] Date of Patent: May 12, 1987

[54] WIDE BAND AUTOMATIC GAIN CONTROL WITH LIMITING AMPLIFIERS

[75] Inventor: Thomas R. Lange, Marion, Iowa

[73] Assignee: Texas Instruments Incorporated, Dallas, Tex.

[21] Appl. No.: 736,189

[22] Filed: May 20, 1985

[51] Int. Cl.⁴ .............................................. H04B 1/16
[52] U.S. Cl. .................................... 455/249; 455/240; 455/245
[58] Field of Search .............. 455/240, 245, 249, 234; 375/98; 367/65, 67; 330/278

[56] References Cited

U.S. PATENT DOCUMENTS

| 3,296,534 | 1/1967 | Graves et al. | 455/249 |
| 3,774,113 | 11/1973 | Chasek | 455/249 |
| 4,013,964 | 3/1977 | Skutta | 455/245 |
| 4,509,206 | 5/1985 | Carpe et al. | 455/249 |

Primary Examiner—Benedict V. Safourek
Assistant Examiner—Elissa Seidenglanz
Attorney, Agent, or Firm—Richard K. Robinson; Leo N. Heiting; Melvin Sharp

[57] ABSTRACT

A high speed communication receiver has a preamplifier stage, an IF stage which includes an attenuation stage having a variable attenuator and a limiting amplifier, a power splitter, an automatic gain control (AGC) circuit having a fullwave detector connected to the power splitter and supplying an amplitude adjusting signal to a mixer where it is mixed with a bias control signal for connection to the variable attenuator with the bias control voltage fixing the operating range midpoint of the variable attenuator and the limiter amplifier for limiting the initial high amplitude portion of the signal pulse resulting from the AGC control voltage reaction time to a level just beyond the top of the dynamic range for enhacing the response time of the receiver and a data processor means including an amplifier connected to the power splitter for restoring the IF stage output signals, a downconverter for converting the frequency to that compatible with an A/D converter, an A/D converter for digitizing the signals and a data processor for processing the information of the digitized signals.

10 Claims, 3 Drawing Figures

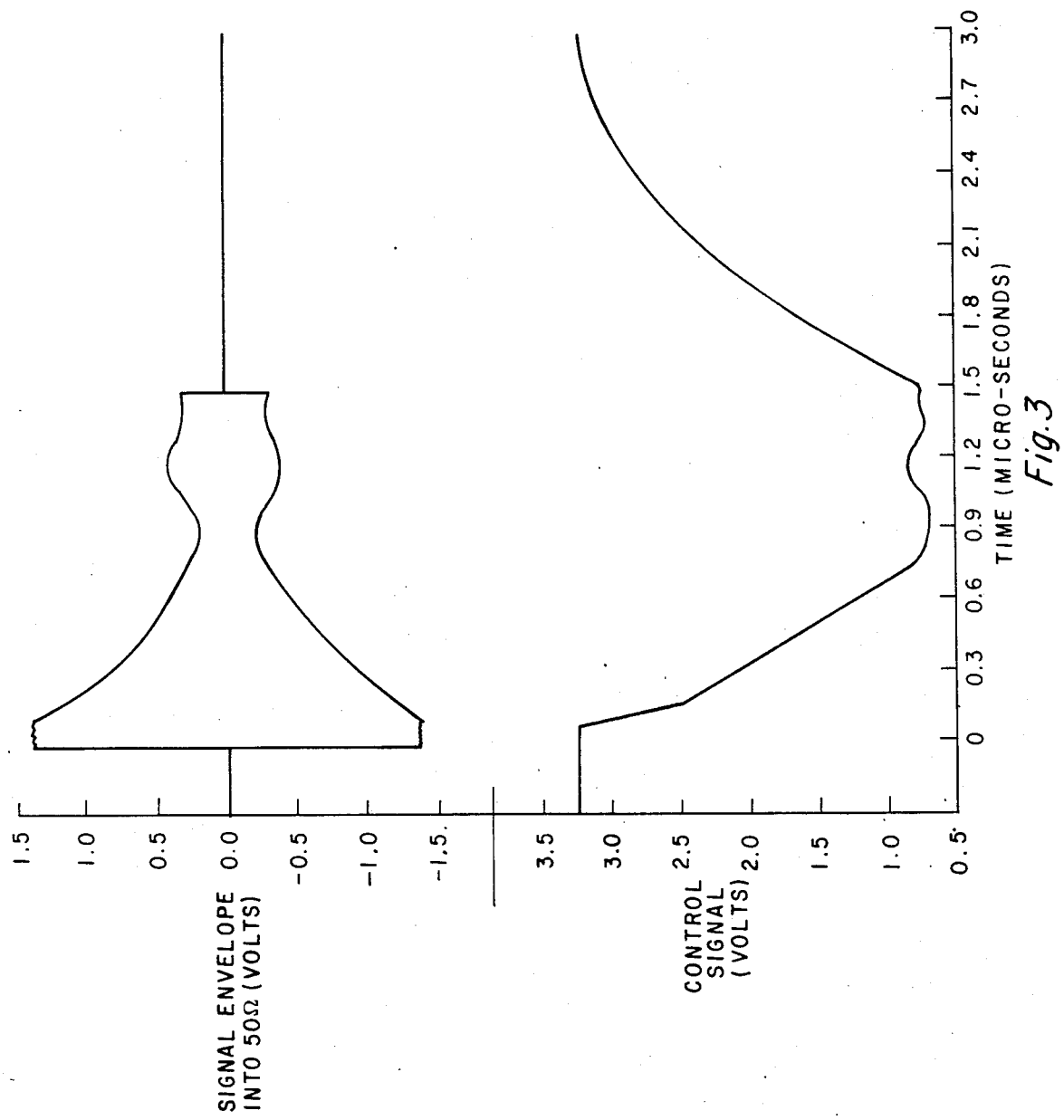

4,665,560

WIDE BAND AUTOMATIC GAIN CONTROL WITH LIMITING AMPLIFIERS

This invention was made with Government support under contract no. F33657-83-C-2102 awarded by the U.S. Air Force. The Government has certain rights in this invention.

BACKGROUND OF THE INVENTION

This invention relates to communication receivers and more particularly to a very fast automatic gain control circuit.

In the past automatic gain control (AGC) circuits have been used in almost all communication receivers. With audio (voice) systems the response time of the AGC has been 30 milli-seconds or more. This response time is acceptable for voice communication systems, but is not fast enough for use in high speed communication systems. For high speed communication receiver systems, a very fast AGC response time is required to prevent loss of information.

In an article by A. Uhlir, Jr., "The Potential of Semiconductor Diodes in High-Frequency Communications", Proc. IEEE, vol. 46, pp. 1099–1115, June 1958, it was recognized that a p-i-n diode limiter circuit can be used to maintain a fairly constant output amplitude from a variable-frequency oscillator; the accuracy might be improved by a feedback circuit that adjusts the bias voltage in accordance with a power monitor.

Further, L. J. Giacoletto, Electronics Designer's Handbook, (2nd Ed. 1977), pp 24-163–24-167 teaches the use of p-i-n diodes as variable attenuators at very high frequencies. The field of applications of p-i-n diodes ranges from about 10 MHz to a few GHz and from lumped AGC circuits to constant-impedance attenuators in distributed structures and antenna switches. A fairly constant operation can be obtained over a wide frequency range, say from 50 MHz to 1 GHZ; the minimum attenuation is only approximately 1 dB, and the increase in noise factor is small.

The major problem with a fast AGC is instability. The instability in a wide dynamic range AGC is mainly due to the size of the input signal which lasts in duration a time equal to the response time.

SUMMARY OF THE INVENTION

Accordingly it is an object of this invention to provide a high speed communication system having improved information retention capabilities.

Another object of the invention is to provide a high speed communication system with increased stability.

Still another object of the invention is to provide a means for limiting the amplitude of the input signal to a value just beyond the top of the system's dynamic range.

Briefly stated the invention comprises a communication receiver which includes at least one wide band limiting amplifier for a very fast automatic gain control circuit. The size of an input signal's dynamic range is compressed for digitization and digital processing. Thus, weak signals transmitted far away from the receiver can be processed with the same resolution as those close to the receiver.

Other objects and features of the invention will become more readily apparent from the following detailed description when read in conjunction with the accompanying drawings.

BRIEF DESCRIPTION OF THE DRAWINGS

FIG. 3 is a drawing showing the AGC response output signal, control signal versus time.

DETAILED DESCRIPTION OF THE INVENTION

Figure 1:
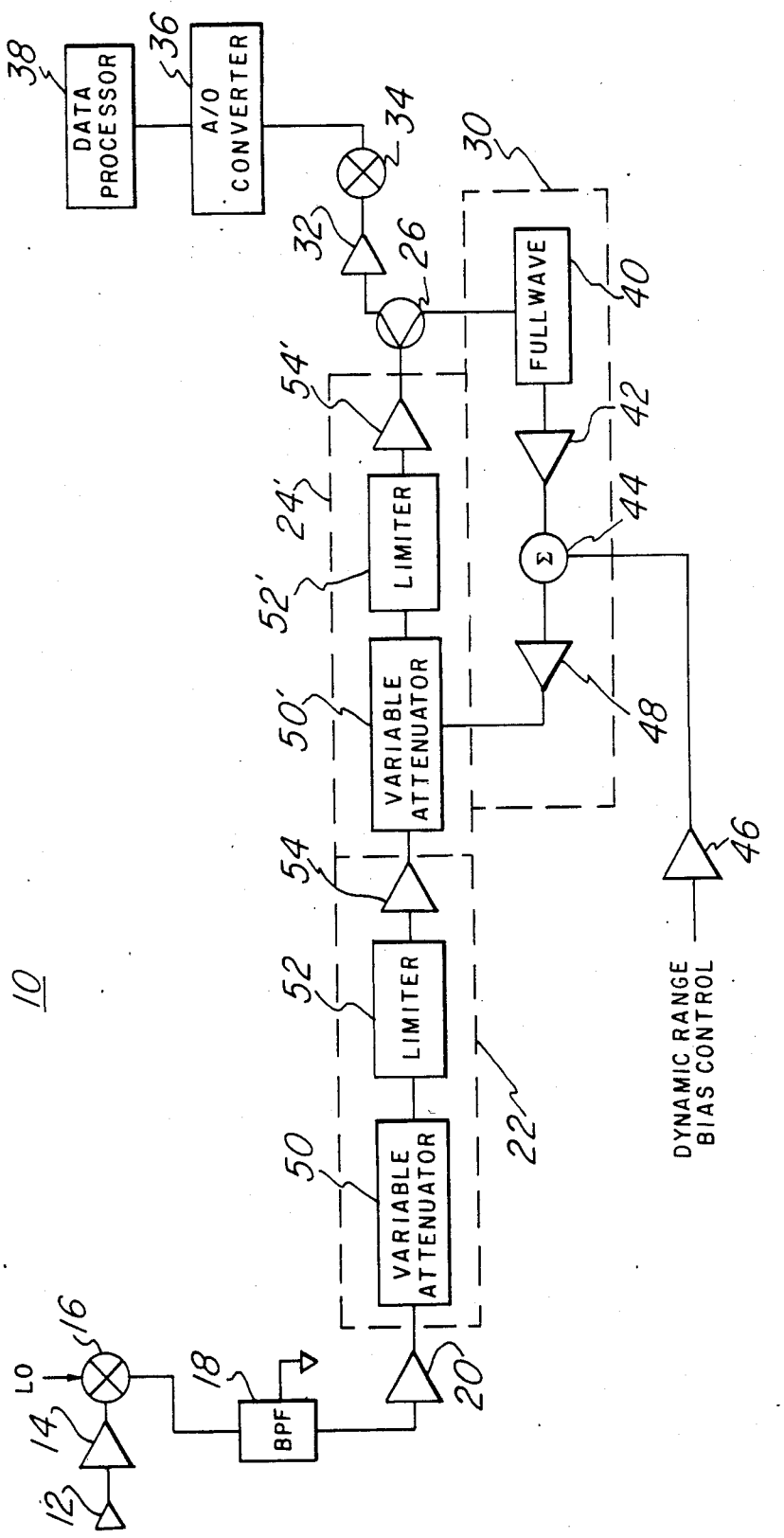
FIG. 1 is a functional block diagram of the present invention.

Referring now to FIG. 1, the high speed communication receiver 10 includes an antenna 12 for receiving RF energy. A preamplifier 14 is connected to the antenna 12 for amplifying the received RF energy to a working level. A mixer 16 is connected to the preamplifier 14 for down converting the received RF energy frequency to an intermediate frequency (IF). A bandpass filter 18 for transmitting ac whose frequencies are between preselected cutoff values. An amplifier 20 is connected to the bandpass filter 18 for restoring the filter signal to its working level. A first stage attenuator 22 is connected to the amplifier 20 for attenuating the IF signal a first increment, and a second stage attenuator is connected in cascade to the first stage attenuator for attenuating the IF signal to a preselected value without distortion and with amplitude limiting to a point just above the top of the dynamic range (FIG. 3). A power splitter 26 (FIG. 1) divides the power for an AGC circuit 30 and a data processor circuit. The data processing circuit comprises an amplifier 32 connected to one port of the power splitter 26 for restoring the working level of the IF signal. A mixer 34 is connected to the amplifier 32 for down converting its output to a level compatible to that of analog to digital (A/D) converter 36. A/D converter 36 digitizes the signals for processing in data processor 38. The data processor is connected to A/D converter 36.

The AGC control circuit 30 includes a full wave (peak to peak) detector 40 connected to the power splitter 26 for detecting the peak voltages of the IF. An amplifier 42 is connected to the full wave detector 40 for restoring the working level of the signal. A summer 44 sums the output of the amplifier 42 to the output of a dynamic range bias control amplifier 46. An amplifier 48 is attached to the summer 44 for amplifying its output to a working level. The amplified output of amplifier 48 is connected to variable attenuators 50 and 50' of attenuator stages 22 and 24 with the bias control voltage fixing the operating range midpoint of the variable attenuators 50 and 50'.

The attenuator stages 22 and 24 are identical in construction and include, in addition to the variable attenuators 50 and 50', limiters 52 and 52' and amplifiers 54 and 54'. The first attenuator stage 22 has its variable attenuator 50 connected to the IF amplifier 20 for attenuating the incoming IF signal. The limiter 52 is connected to the variable attenuator for selectively limiting the amplitude of the initial high amplitude signal pulse (created as a result of finite AGC control voltage reaction times) (FIG. 3) to a level just beyond the top of the dynamic range. The amplifier 54 is connected to the limiter 52 for restoring the value of the IF output of the limiter.

The second attenuator stage further attenuates the IF signals to a preselected level without distortion.

Amplifier 14 is a standard preamplifier, amplifier 20 is a WJ-A77 sold by Watkins-Johnson, Inc., amplifiers 32, 54 and 54' are WJ-A88s sold by Watkins-Johnson and amplifiers 42, 46 and 48 are AD 380s sold by Analog Devices Co. The limiters 52 and 52' are WJ-AL7s sold by Watkins-Johnson. The variable attenuators are pin attenuator devices, HPND 4165 PIN diodes, sold by Hewlett Packard. The power divider 26 is a DS 109 sold by ANZAC Corporation. The summer 44 is an Op Amp AD380 sold by Analog Devices Company and the mixers 16 and 34 are standard mixers. The A/D converter is, for example, a TDC 1027 sold by the TRW Company.

Figure 2:
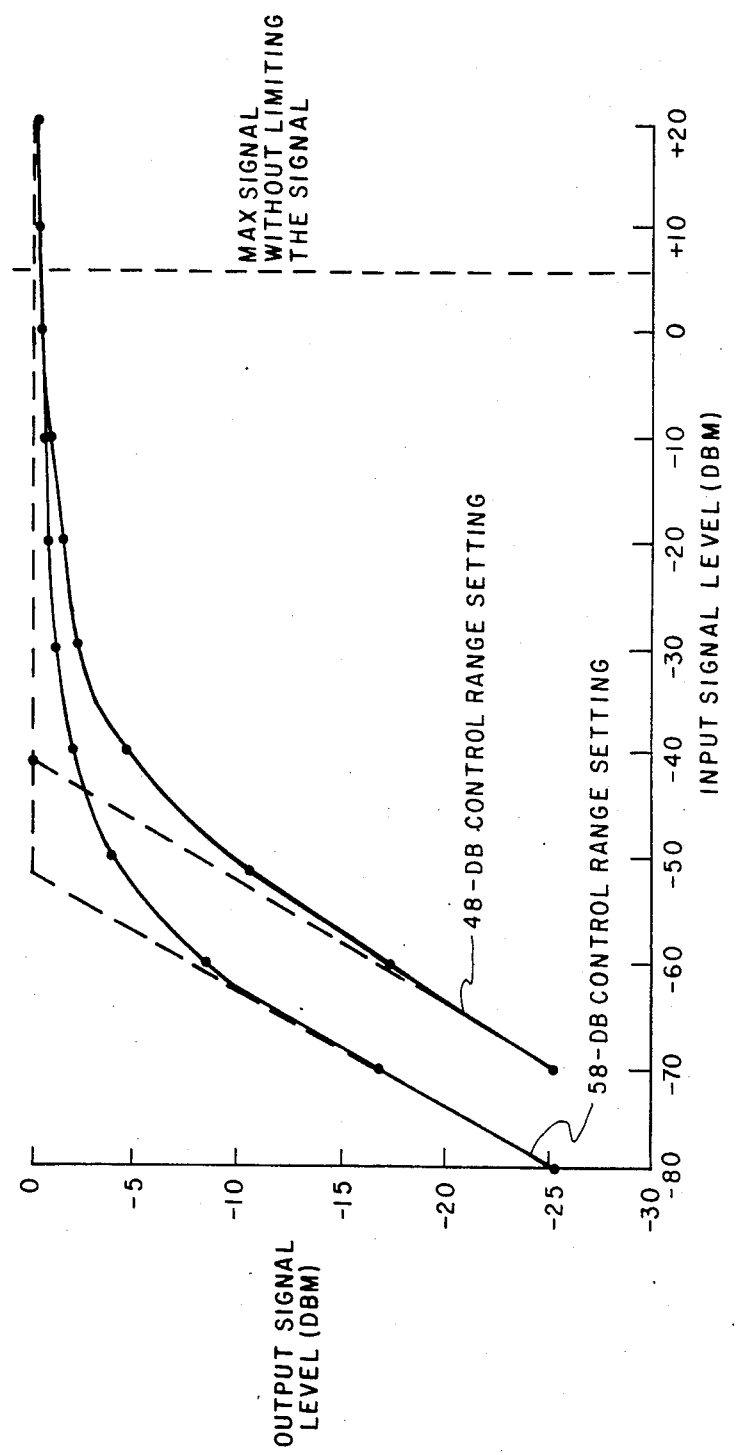
FIG. 2 is a drawing showing the AGC response output power versus the input power.

Referring now to FIG. 2, the AGC response output signal level in dBm is shown for the input signal level. The maximum input signal which can be obtained without limiting the signal is shown by the dotted line; it is about 6 dBm. The AGC response for the output signal and control signal in volts versus time in micro-seconds is shown in FIG. 3. In a working model a 55 dB AGC with a response time of 750 nano-seconds for the full dynamic range and 300 nano-second for half the dynamic range was achieved; testing showed that for a 55 dB AGC range the maximum attack time was 750 nano-seconds and the maximum decay time was 1500 nano-seconds.

Although only a single embodiment of the invention has been described, it will be apparent to a person skilled in the art that various modifications to the details of construction shown and described may be made without departing from the scope of this invention.

What is claimed is:

1. A high speed communication receiver comprising:
   (a) an antenna for receiving RF energy;
   (b) a first mixer stage connected to the antenna for for down converting the received RF energy to a to a first intermediate band of frequencies;
   (c) a bandpass filter connected to the first mixer stage for passing frequencies of the first intermediate band of frequencies between preselected cutoff values to obtain an IF signal thereby;
   (d) an automatic gain control circuit that includes a full wave detector operatively connected to an attenuator stage for peak to peak detection of attenuated output signals from the attenuator stage to obtain a gain signal, a dynamic range bias control means for providing a dynamic range bias control signal and a summer for adding the gain signal and dynamic range bias control signal for input to the attenuator stage;
   (e) the attenuator stage means connected to the bandpass filter and to the automatic gain control circuit for attenuating the IF signal to preselected values and limiting the amplitude of the IF signal; and
   (f) a data processor means operatively connected to the attenuator stage for processing the attenuated and amplitude limited IF signal.

2. The high speed communication receiver according to claim 1 wherein the attenuator stage means includes first and second attenuator stage means operatively connected in cascade.

3. The high speed communication receiver according to claim 1 wherein the attenuator stage means includes an attenuator stage having a variable attenuator operatively connected to the bandpass filter and to the automatic gain control circuit for selectively reducing the strength of the IF signal with minimum distortion, and a limiter means operatively connected to the variable attenuator means for limiting the amplitude of the antunated IF signal.

4. A high speed communication receiver comprising:
   (a) an antenna for receiving RF energy;
   (b) a first mixer stage for down converting the incoming RF energy to an IF signal;
   (c) an intermediate frequency stage connected to the preamplifier stage including a bandpass filter for transmitting frequencies of the IF signal between preselected cutoff values, an amplifier connected to the bandpass filter for restoring the working level of the filtered IF signal, and an attenuator stage operatively connected to the intermediate frequency stage for limiting the amplitude of the filtered IF signal;
   (d) a power splitter operatively connected to the attenuator stage for power splitting of the filtered IF signal to obtained a divided signal;
   (e) an automatic gain control circuit operatively connected to the power splitter and includes a full wave detector operatively connected to the attenuator stage for peak to peak detection of filtered and limited If signal from the attenuator stage to obtain a gain signal, a dynamic range bias control means for providing a dynamic range bias control signal and a summer for adding the gain signal and dynamic range bias control signal for input to the attenuator stage for maintaining essentially constant the amplitude of the filtered IF signal despite variation in the strength of the received RF energy; and
   (f) a data processor operatively connected to the power splitter for processing the filtered and limited IF signal.

5. The high speed communication receiver according to claim 4 wherein the attenuator stage includes a variable attenuator for adjusting the strength of the filtered IF signal to a preselected level without distortion, a limiter operatively connected to the variable attenuator for limiting the filtered IF signal.

6. The high speed communication receiver according to claim 5 further comprising a second attenuator stage connected in cascade with the attenuator stage, the structure of the second attenuator stage being substantially that of the attenuator stage.

7. The high speed communication receiver according to claim 5 wherein the variable attenuator is a p-i-n diode type variable attenuator.

8. The high speed communication receiver according to claim 5 wherein the limiter is a limiting amplifier.

9. The high speed communication receiver according to claim 4 wherein the data processor means includes an amplifier coupled to the power splitter for amplifying the the divided, filtered and limited If signal to obtain an incoming signal, a down converter operatively connected to the amplifier for selectively down converting the incoming signal, an analog to digital converter for digitizing the down converted incoming signal and a data processor for processing the digitized down converted incoming signals.

10. A high speed communication receiver comprising: a preamplifier stage and an intermediate frequency stage connected to the preamplifier stage, an attenuation stage having a variable attenuator and a limiting amplifier, a power splitter connected to the attenuation stage, an automatic gain control circuit having a full-wave detector connected to the power splitter and supplying an amplitude adjusting signal, a summer for adding the amplitude adjusting signal with a bias control signal to obtain a gain control signal for application to the variable attenuator with the gain control signal fixing an operating range mid-point of the variable attenuator and the limiting amplifier provides amplitude limitations to signals applied thereto and a data processor means including an amplifier connected to the power splitter, a downconverter operatively connected to an A/D converter and a data processor opertatively connected to the A/D converter.

* * * * *